(12) United States Patent
Forster et al.

(10) Patent No.: US 7,065,328 B1
(45) Date of Patent: Jun. 20, 2006

(54) SUPERREGENERATIVE AM DEMODULATOR

(76) Inventors: Ian J Forster, 31 Great Cob, Springfield, Chelmsford, Essex (GB) CM1 6LA; Adrian N Farr, The Mill House, Bran End, Stebbing, Dunmow, Essex (GB) CM6 3RS ( * ) Notice: Subject to any disclaimer, the term of this patent is extended or adjusted under 35 U.S.C. 154(b) by 308 days.

(21) Appl. No.: 10/018,762

(22) PCT Filed: Jun. 1, 2000

(86) PCT No.: PCT/GB00/02093

§ 371 (c)(1),
(2), (4) Date: Apr. 18, 2002

(87) PCT Pub. No.: WO00/79678

PCT Pub. Date: Dec. 28, 2000

(30) Foreign Application Priority Data

Jun. 17, 1999 (GB) .................................. 9913989.1

(51) Int. Cl.
*H04B 1/40* (2006.01)

(52) U.S. Cl. .......................... 455/84; 455/73; 455/214; 455/248.1; 455/289; 455/108; 342/42; 375/324; 375/300

(58) Field of Classification Search ................ 455/313, 455/321, 323, 336, 73, 78, 84, 41.2, 110, 455/108, 202, 203, 205, 215, 289, 214, 82, 455/248.1; 330/277, 293, 296; 342/42, 342/51, 44, 50; 340/10.1–10.5; 375/302, 375/324, 320
See application file for complete search history.

(56) References Cited

U.S. PATENT DOCUMENTS 3,299,358 A * 1/1967 Wood .......................... 455/355

(Continued)

FOREIGN PATENT DOCUMENTS

GB           2 284 323 A       5/1995

(Continued)

OTHER PUBLICATIONS

*A 60 Ghz HEMY-MMIC Analog Frequency Diider by two*, J. C. Sarkissian, et al., GaAs IC Symposium, IEEE 1994, pp. 104-107.

Primary Examiner—Edward F. Urban
Assistant Examiner—Blane Jackson
(74) Attorney, Agent, or Firm—Christensen O'Connor Johnson Kindness PLLC

(57) ABSTRACT

An AM receiver incorporates an antenna, a transistor, a current source, and a power supply. The antenna is connected to a gate electrode of the transistor and through a link to a signal earth. In operation, the antenna receives radiation and generates a corresponding input signal which propagates to the gate electrode. The transistor is operable to process the input signal in two steps, namely to reflectively amplify the input signal to generate a correspondingly reflectively amplified input signal at the gate electrode in a first step, and amplitude demodulate the amplified input signal in a second step. The transistor is operable in a non-linear region of its current/voltage characteristic whereas it simultaneously provides reflective amplification and signal demodulation, namely the two steps occur simultaneously. In contradistinction, conventional demodulators employing gain devices operating non-linearly to provide amplitude demodulation incorporate the devices configured to function as transmission amplifiers.

18 Claims, 2 Drawing Sheets

U.S. PATENT DOCUMENTS

Figure 1:
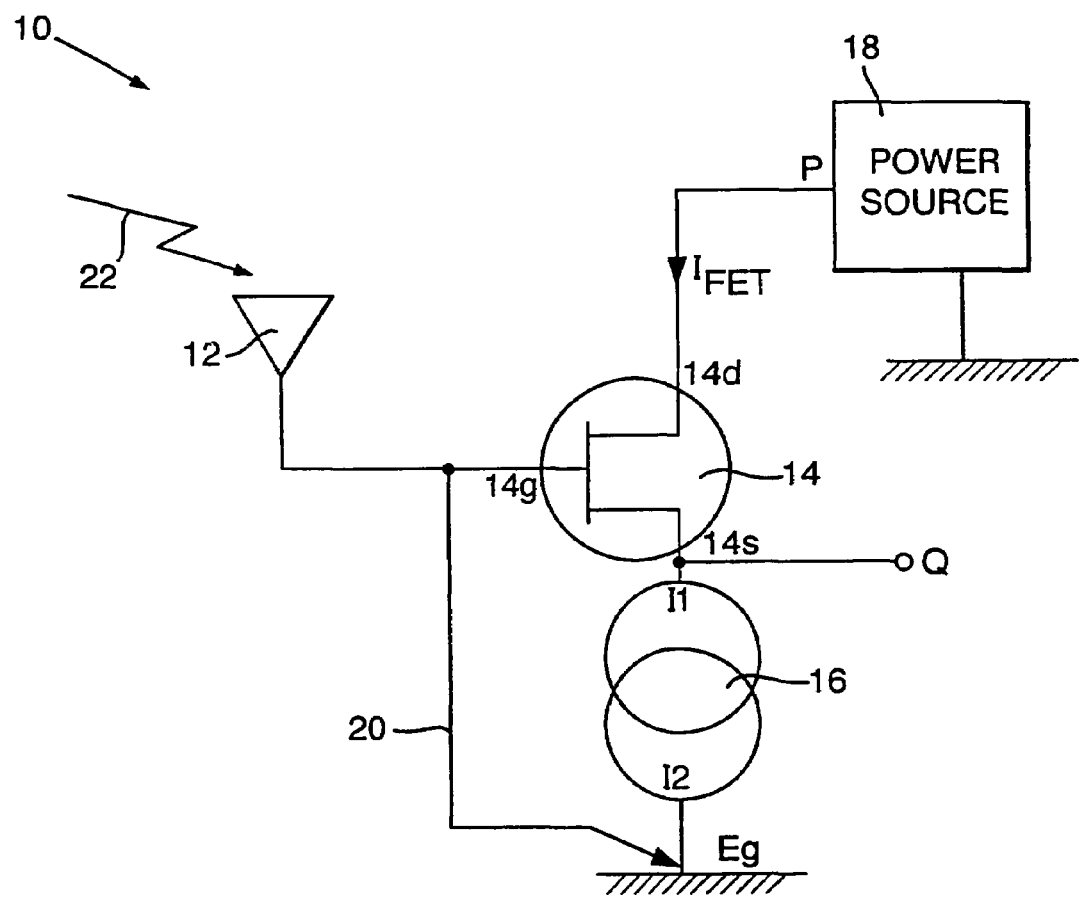

| | | | |
|---|---|---|---|
| 3,510,781 A | * | 5/1970 | Wollesen .................... 455/321 |
| 3,863,136 A | | 1/1975 | Hanson |
| 4,112,373 A | | 9/1978 | Miyamoto et al. |
| 4,403,347 A | | 9/1983 | Iso et al. |
| 4,563,772 A | | 1/1986 | Beneking et al. |
| 4,631,500 A | | 12/1986 | Rauscher |
| 5,305,469 A | * | 4/1994 | Camiade et al. ............... 455/78 |
| 5,404,585 A | * | 4/1995 | Vimpari et al. .......... 455/115.1 |

FOREIGN PATENT DOCUMENTS

GB    2284323 A  *  5/1995

* cited by examiner

SUPERREGENERATIVE AM DEMODULATOR

The present invention relates to an amplitude modulation (AM) receiver for amplifying and detecting amplitude modulated radiation and signals.

Conventional receivers operable to receive amplitude modulated radiation and generate corresponding demodulated signals, for example receivers such as domestic radios, often incorporate a number of sections; these sections conventionally comprise an antenna for receiving the radiation and generating a corresponding received signal, transmission radio frequency (r.f.) amplifiers for amplifying and filtering the received signal to provide an amplified signal and a detector for demodulating the amplified signal to provide a demodulated output signal. These sections consume significant power when operational, even when operating at reduced power in stand-by mode awaiting incoming radiation, for example awaiting radiation bearing "wake-up-codes" in mobile telephones. This significant power consumption is a problem which limits operating time from a given set of batteries supplying power to the sections. This problem also pertains to radio transponder tags incorporating miniature power cells to provide electrical power thereto, for example as incorporated into identity tags and electronic access keys for automobiles.

A further problem arises in conventional receivers where the received signal is often in the order of microvolts and where considerable amplification is required to provide amplified signals of sufficient magnitude to operate detection diodes in detectors of the receivers; such detectors often exhibit cutoff voltages which prevent them from detecting signals presented thereto below a minimum threshold amplitude. Because there is a practical limit to a degree of amplification that can be provided without risking spurious oscillations arising, this practical limit imposes a lower threshold amplitude for received radiation, and hence a limited operating range, to which the receivers are responsive. This lower threshold amplitude is a problem in some applications, especially where more remote receiver operation is contemplated.

In conventional receivers, it is a well known principle that an r.f. transmission amplifier providing a non-linear transfer characteristic can be used as a demodulator for demodulating amplitude modulated signals. This principle was frequently employed in the context of thermionic electron tubes incorporated into radio receivers before a time when silicon semiconductor devices became widely available, the electron tubes functioning as transmission amplifiers.

The inventor has appreciated that it is feasible to combine a number of radio receiver sections together to obtain a simplified receiver circuit which counteracts one or more of the problems described above.

According to a first aspect of the present invention, there is provided an AM receiver for receiving an input signal and generating a corresponding demodulated signal, characterised in that the receiver incorporates a transistor biased to be simultaneously operable as a reflection amplifier for reflectively amplifying the input signal and as a detector for detecting the amplified input signal to generate the demodulated signal.

The invention provides the advantage that the receiver is capable of:

(a) consuming less power on account of exploiting reflective amplification, in contrast to transmission amplification employed in the prior art; and (b) being more sensitive to the input signal because detection diodes imposing a lower response threshold are not incorporated therein.

Conveniently, detection of the amplified input signal occurs by the transistor providing signal mixing therein. Advantageously, the transistor is operable in a non-linear region of its current/voltage transfer characteristic. This provides the advantage that the amplified input signal is mixed with itself, namely "autoheterodyned", to demodulate it directly to baseband to provide the demodulated signal.

Advantageously, the transistor functions in its non-linear region at a relatively low supply current, thereby making the receiver more power efficient. Thus, for example, the transistor can be operable to conduct a current therethrough in a range of 5 µA to 100 µA when functioning in its non-linear region.

In order for the transistor to function simultaneously as a reflection amplifier and as a detector, the transistor is preferably configured so that amplified reflected signals are generated at an input of the transistor for subsequent detection in the transistor; the transistor presents a negative input resistance at its input to achieve this function. In contrast, conventional non-linear mixers employing transmission amplifiers do not generate amplified signals at their inputs and do not then inject them back for demodulation purposes. Conveniently, the transistor incorporates an electrode for receiving the input signal, the electrode being connected through a signal path to a signal earth such that the path is operable to convey reflected signals between the transistor and the signal earth, and to divert the input signal to the electrode.

According to a second aspect of the invention, receivers according to the first aspect of the invention can be incorporated into a GPS receiver, thereby providing it with relatively reduced operating current consumption and increased detection sensitivity. Conveniently, the GPS receiver incorporates a plurality of receivers according to the invention, receiving means for receiving input radiation and generating a corresponding received signal, and processing means for filtering, amplifying and gating the received signal to provide input signals for the plurality of receivers to demodulate to provide demodulated signals from which a positional reference for the GPS receiver is derivable.

According to a third aspect of the invention, the invention provides a method of amplitude demodulating an input signal using an AM receiver according to the first aspect, the method comprising the simultaneously executable steps of:

(a) receiving the input signal and reflectively amplifying it in the transistor to generate an amplified input signal; and (b) passing the amplified input signal through the transistor operating in a non-linear mode to demodulate it and thereby generate a corresponding demodulated signal.

Figure 2:
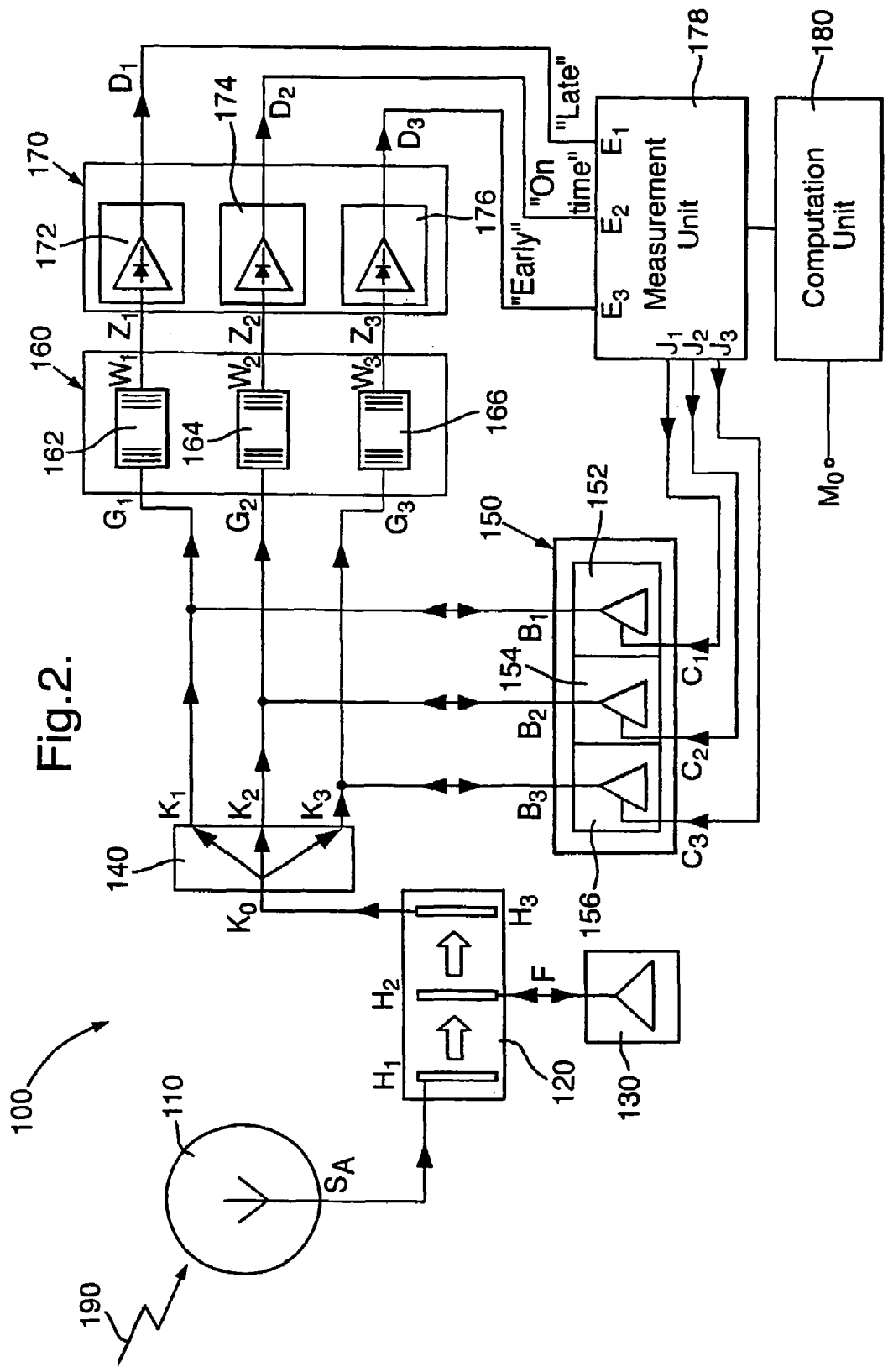

Embodiments of the invention will now be described, by way of example only, with reference to the following diagrams in which:

FIG. 1 is a schematic diagram of a first embodiment of an AM receiver according to the invention; and FIG. 2 is a schematic illustration of a GPS receiver incorporating the receiver shown in FIG. 1.

Referring to FIG. 1, there is illustrated an AM receiver indicated by 10. The receiver 10 incorporates a patch antenna 12, a gallium arsenide (GaAs) field effect transistor (FET) 14, a current source 16 and a power source 18. The antenna 12 is connected to a gate electrode 14g of the transistor 14 and also through a link 20 to a signal earth Eg. The power source 18 incorporates an output P connected to a drain electrode 14d of the transistor 14. The transistor 14 also incorporates a source electrode 14s which is connected to a first terminal I1 of the current source 16. A second terminal I2 of the source 16 is also connected to the signal earth Eg. The link 20 and the terminal I2 are both connected at a single point onto the signal earth Eg.

The source electrode 14s is also connected to an output Q whereat a demodulated signal is provided from the receiver 10.

Operation of the receiver 10 will now be described with reference to FIG. 1. The transistor 14 is in a grounded gate configuration so that a positive bias provided by the power supply 18 at its output P causes a current $I_{FET}$ in the order of microamperes to flow between the electrodes 14d, 14s and through the current source 16. Preferably, $I_{FET}$ is in a range of 5 µA to 100 µA. The current $I_{FET}$ is sufficiently small for the transistor 14 to operate as a reflection amplifier in a non-linear region of its transfer characteristics. It has been experimentally verified that the transistor 14 provides reflective amplification by measuring a signal gain provided by the receiver 10; it is not possible for the receiver 10 to provide such high amplification if the transistor 14 were functioning as a transmission amplifier. The current source 16 is operable to maintain the transistor 14 biased in the non-linear region.

The antenna 12 receives incoming radiation 22 and converts it to a received signal SR. The signal $S_R$ propagates from the antenna 12 to the gate electrode 14g and through the link 20. The link 20 provides an approximately quarter wavelength signal path between the signal earth Eg and the gate electrode 14g at the carrier frequency of the radiation 22; as a consequence, the link 20 does not divert the received signal $S_R$ from the gate electrode 14g because a low impedance presented by the link 20 where it connects to the earth Eg is transferred to an open circuit at the gate electrode 14g. The link 20 also functions as an impedance matching component; its length can be trimmed to afford an impedance match between the transistor 14 and the antenna 12.

The transistor 14 operates on the signal $S_R$ in a two stage process, namely the transistor 14:

(a) amplifies the received signal $S_R$ at its gate electrode 14g by reflection to generate an reflectively amplified signal $S_A$ thereat; and then
(b) demodulates the signal $S_A$, by virtue of the transistor 14 providing a non-linear transfer characteristic, to output a demodulated signal at the source electrode 14s. The demodulated signal propagates to the output Q for subsequent processing.

In practice, the two stages (a) and (b) occur simultaneously.

In contrast to this two stage process, prior art demodulators do not provide in-situ reflective amplification and simultaneous detection and are therefore relatively less sensitive in comparison to the receiver 10. In contradistinction to the receiver 10, conventional demodulators employing gain devices operating non-linearly to provide amplitude demodulation incorporate the devices configured to function as transmission amplifiers. In its reflection mode of operation, the transistor 14 provides a square law signal transfer characteristic according to Equation 1:

$$i_{FET}=k_0(v_{gs})^2 \qquad \text{Eq. 1}$$

where
$i_{FET}$=small signal change in $I_{FET}$;
$v_{gs}$=small signal change in potential difference between the gate electrode 14g and source electrode 14s; and
$k_0$=a gain constant.

Assuming to a first approximation that:

$$v_{gs}=k_1 S_R \qquad \text{Eq. 2}$$

where $k_1$=constant,
and that:

$$S_R k_2 S_m \sin \omega_R t \qquad \text{Eq. 3}$$

where
$k_2$=a constant;
$S_m$=an amplitude modulating signal;
$\omega_R$=angular carrier frequency of the radiation 22; and
t=time, then from Equations 1 to 3:

$$i_{FET}=k_0 k_1^2 k_2^2 S_m^2 \sin^2 \omega_R t = \tfrac{1}{2} k_0 k_1^2 k_2^2 S_m^2 (1-\cos 2\omega_R t) \qquad \text{Eq. 4}$$

If high frequency components, namely at the angular frequency $\omega_R$ and higher, are filtered out from the output Q, then the output will be according to Equation 5:

$$Q=k_3 S_m^2 \qquad \text{Eq. 5}$$

where $k_3$=a constant, namely $k_3=k_0 k_1^2 k_2^2$.

In practice, filtration of the high frequency components will occur in circuits connected to the receiver 10, for example audio amplifiers exhibiting a bandwidth from 50 Hz to 20 kHz, which are not responsive to such components.

Equation 5 corresponds to a demodulated baseband signal at the output Q. Thus, the transistor 14 is capable of providing signal amplification at low operating currents and also providing direct demodulation to baseband.

If the signal $S_m$ is digital binary data, non-linearity implicit in Equation 5 is inconsequential.

The receiver 10 provides the advantages that:
(i) it operates on relatively low currents, for example µA;
(ii) it provides both amplification and detection directly from high frequencies to baseband;
(iii) it is capable of operating with signals of relatively lower amplitude than conventional receivers; and
(iv) it is potentially cheap and requires few component parts.

The advantages make the receiver 10 attractive for use in short distance radio links such as wireless local area computer networks, for remotely interrogatable identification tags, and for use as enhanced performance detectors in mobile telephones and in global positioning system (GPS) receivers.

The receiver 10 provides a synergistic advantage of reflective amplification and detection using a single transistor. Moreover, the receiver 10 is capable of operating at microwave frequencies, for example around 1.5 GHz; experimental results at these frequencies have demonstrated that it can amplify and detect amplitude modulated radiation giving rise to a received signal from the antenna 12 in the order of −80 dBm. The results demonstrate that the receiver 10 is a considerable improvement compared to conventional diode-type detectors which cannot detect such small received signals without considerable transmission amplification being employed to amplify the received signals prior to diode detection.

Applications of the receiver 10 include use as:
(a) low power receivers for multimode tag devices, for example personnel wearable tags. Conventional multimode tags are capable of transmitting messages in an active mode at a greater range than they are capable of receiving messages in a semi-passive mode. The active mode has the disadvantage that higher levels of power consumption are associated therewith compared to the semi-passive mode. Conventionally, tag power consumption can be reduced by sampling techniques where the tags enter their active mode for a relatively short period at intervals; use of these techniques results in complex operating protocols for the tags. The receiver 10 is capable of providing, when incorporated into a multimode tag, a highly sensitive "wake-up" receive capability which provides the tag with an enhanced operating range and reduces the need for complex operating protocols;

(b) security receivers for automobiles. Such security receivers incorporating the receiver 10 are capable of:
  (1) exhibiting lower power consumption, for example consuming in the order of tens of µW;
  (2) being of lower cost; and
  (3) operating at ultra high frequencies (UHF) around 500 MHz to 600 MHz and above compared to conventional security receivers.

Security receivers incorporating the receiver 10 can be operative to communicate security codes, for example "radio keys" allowing authorised access to vehicles and control of immobilisation systems incorporated therein. The receiver 10 is sufficiently simple and compact to incorporate into a key fob, thereby enabling bi-directional communication links to be provided between vehicles and their associated key fobs. Such bi-directional links enable more complex security protocols to be used, thus enhancing security, and permits further added value functions to be added in the fobs, for example memorising an associated vehicle's parking position in a car park incorporating a constellation of low power radio transmitters from which the fobs can derive positional references; and (c) ultra low power GPS receivers.

GPS receivers are well known for use in determining positional references on the earth's surface. A conventional GPS receiver functions by transmitting encoded radiation at a number of carrier frequencies in the order of 1.5 GHz to a constellation of equatorial geostationary satellites and measuring time durations for the radiation to reach the satellites, to be amplified therein and then transmitted therefrom and be received back at the GPS receiver. Each satellite is responsive to radiation in a particular frequency range associated therewith. Distances corresponding to the time durations are calculated in the GPS receiver and geometrical computations then applied to determine a positional reference for the receiver from the distances because the positions of the satellites are known in advance. The radiation emitted by the GPS receiver is encoded by a pseudo-random bit sequence generated within the receiver; this encoding enables the GPS receiver to recognise its radiation transmitted back from the satellites.

Determination of time duration is achieved in the GPS receiver by correlating "early", "on time" and "late" versions of the pseudo-random bit sequence with radiation received back at the GPS receiver. This is necessary in order to ensure signal synchronisation and hence achieve a reliable and accurate time duration measurement.

Referring now to FIG. 2, there is shown a GPS receiver indicated by 100. The receiver 100 incorporates a circularly polarised antenna 110, a magnetostatic surface wave device (MSWD) filter/isolator 120, a reflection amplifier 130, a three-way splitter unit 140, an assembly of reflection amplifiers 150, an assembly of narrowband surface acoustic wave filters 160, and an assembly of receivers 170. The assembly 170 incorporates three receivers 172, 174, 176 which are each identical to the receiver 10 in FIG. 1. The receiver 100 also incorporates a measurement unit 178 for processing "late", "on time" and "early" outputs generated by the assembly 170 and generating signals at terminals $J_1$, $J_2$, $J_3$ for use in the assembly 150. Moreover, the receiver 100 additionally incorporates a computation unit 180 for determining a positional reference by triangulation from time measurements provided by the measurement unit 178 to provide the positional reference as data at a terminal $M_0$ of the unit 180. Design of the measurement unit 178 and the computation unit 178 will be familiar to one ordinary skilled in the art of GPS receiver design.

The reflection amplifier 130 and the assembly 150 incorporate reflection amplifiers according to our UK patent GB 2 284 323 B whose contents are hereby incorporated by reference with regard to transistors functioning as reflection amplifiers when operating in a linear region of their transfer characteristics. The reflection amplifiers each comprise a field effect transistor (FET), namely a silicon junction FET (JFET) or a gallium arsenide (GaAs) device, configured by means of a feedback arrangement such as to operate within a linear region of its current/voltage characteristic such that it reflects a signal received thereat with an increased magnitude.

The antenna 110 incorporates an output $S_A$ which is connected to a first input terminal $H_1$ of the filter/isolator 120. The filter/isolator 120 incorporates a second terminal $H_2$ which is connected to an input/output terminal F of the amplifier 130, and also a third terminal $H_3$ which is connected to an input terminal $K_0$ of the splitter unit 140.

The unit 140 comprises three output terminals $K_1$, $K_2$, $K_3$ connected to input terminals $B_1$, $B_2$, $B_3$ of reflection amplifiers 152, 154, 156 respectively. The reflection amplifiers 152, 154, 156 are incorporated into the assembly 150. The amplifiers 152, 154, 156 also incorporate control terminals $C_1$, $C_2$, $C_3$ to which "late", "on time" and "early" control signals are connected from corresponding terminals $J_1$, $J_2$, $J_3$ of the measurement unit 178 respectively. These control signals are identical pseudo-random bit streams, namely sequences of data, which are time shifted with respect to one another, usually by a period corresponding to ½ or 1 bit duration in the sequences.

The terminals $K_1$, $K_2$, $K_3$ are also connected to inputs $G_1$, $G_2$, $G_3$ of surface acoustic wave (SAW) filters 162, 164, 166 respectively. The filters 162, 164, 166 incorporate outputs $W_1$, $W_2$, $W_3$ which are connected to inputs $Z_1$, $Z_2$, $Z_3$ of the receivers 172, 174, 176 respectively. The receivers 172, 174, 176 include outputs $D_1$, $D_2$, $D_3$ at which "late", "on time" and "early" signals are output respectively. These outputs $D_1$, $D_2$, $D_3$ are connected to corresponding inputs $E_1$, $E_2$, $E_3$ of the measurement unit 178 respectively.

The filter/isolator 120 incorporates a thin layer, namely in a thickness range of 10 µm to 100 µm, of yttrium iron garnet (YIG) deposited onto an aluminum or quartz substrate, which provides a signal propagation path through the isolator 120.

The SAW filters 162, 164, 166 are operable to delay signals propagating therethrough and also bandpass filter them. The amplifier 130 is arranged to amplify signals received thereat and subsequently reflected therefrom by +23 dB. The receivers 172, 174, 176 are operable to provide +20 dB amplification gain as well as amplitude modulation detection as described above with reference to the receiver 10. The amplifiers 152, 154, 156 are switchable at their terminals $C_1$, $C_2$, $C_3$ respectively so that each provides +20 dB gain in a high gain state and −20 dB gain in a low gain state.

Operation of the GPS receiver 100 will now be described with reference to FIG. 2.

The GPS receiver 100 emits from its transmitter units (not shown) connected to the measurement unit 178 encoded radiation to a first geostationary satellite (not shown) which amplifies and transmits the encoded radiation to provide input radiation 190 which is incident on the antenna 110.

The antenna 110 receives the input radiation 190, the radiation being C code GPS radiation at 1574.42 MHz frequency, and generates a signal $S_1$ corresponding thereto. The signal $S_1$ propagates to the first terminal $H_1$ of the filter/isolator 120 through which it passes to the second terminal $H_2$ whereat it is output to the terminal F of the amplifier 130; the filter/isolator 120 is operative to selectively limit components of the signal $S_1$ whose amplitude exceeds a threshold level, the level determined during manufacture of the filter/isolator 120. The amplifier 130 functions as a negative resistance and reflectively amplifies the signal $S_1$ to generate a corresponding amplified signal $S_2$ which propagates from the terminal F back to the terminal $H_2$ of the filter/isolator 120. The signal $S_2$ propagates from the terminal $H_2$ to the terminal $H_3$ at the filter/isolator 120 whereat it is output as a signal $S_3$. The signal $S_3$ propagates to the input $K_0$ of the splitter unit 140 which divides the signal $S_3$ to generate three signals $S_{10}, S_{11}, S_{12}$ at the outputs $K_1, K_2, K_3$ respectively. In response to the control signals applied to the terminals $C_1, C_2, C_3$, the amplifiers 152, 154, 156 selectively reflectively amplify or attenuate the signals $S_{10}, S_{11}, S_{12}$ respectively; thus, the signals $S_{10}, S_{11}, S_{12}$ thereby become time gated such as to assume a prominent amplitude when correlation thereof with one or more of the control signals occurs.

The signals $S_{10}, S_{11}, S_{12}$, switched by the amplifiers 152, 154, 156 respectively to be amplified or attenuated, propagate to the inputs $G_1, G_2, G_3$ respectively. The filters 162, 164, 166 bandpass filter and delay the signals $S_{10}, S_{11}, S_{12}$ propagating therethrough to provide corresponding signals $S_{20}, S_{21}, S_{22}$ at the outputs $W_1, W_2, W_3$ respectively. The inputs $Z_1, Z_2, Z_3$ receive the signals $S_{20}, S_{21}, S_{22}$ which pass to the receivers 172, 174, 176 whereat they are amplified and demodulated to provide "late", "on time" and "early" output signals at the outputs $D_1, D_2, D_3$ respectively. The signals $D_1, D_2, D_3$ propagate to the inputs $E_1, E_2, E_3$ respectively of the measurement unit 178.

The unit 178 monitors the inputs E1, E2, E3 to identify signals thereat corresponding to correlation of the signals present at the terminals $K_1, K_2, K_3$ with those generated within the measurement unit 178 and output via the terminals $J_1, J_2, J_3$ to the terminals $C_1, C_2, C_3$ respectively. By doing so, the measurement unit 178 determines, by an iterative process, a time duration for radiation emitted from the receiver 100 to propagate to the first satellite and be received again by the receiver 100.

The receiver 100 repeats measurements as described above for second and third geostationary satellites to derive three time duration measurements. The measurement unit 178 outputs these measurements to the computation unit 180 which calculates therefrom corresponding distances from which a positional reference is calculated by a process of triangulation to provide positional data at an output $M_0$.

In broad overview, the control signals applied to the terminals $C_1, C_2, C_3$ are used to gate the signal S1 from the antenna 110 to provide the output signals at the outputs $D_1, D_2, D_3$ which are processed by the units 178, 180 for determining the time durations and hence a positional reference for the receiver 100. Determination of the positional reference will be familiar to one ordinarily skilled in the art of GPS receiver design where the output signals at the outputs $D_1, D_2, D_3$ are used to steer a code generator incorporated into the measuring unit 178 for use in synchronisation and hence determining the time durations.

The GPS receiver 100 is capable of operating with lower power consumption compared to conventional GPS receivers. The receiver 100 achieves this lower consumption by exploiting reflective amplification in the amplifier 130, in the assembly of reflection amplifiers 150 and in the assembly of receivers 170. Exploitation of reflective amplification provides an additional advantage of allowing the receiver 100 to be fabricated into a GaAs microwave monolithic integrated circuit (MMIC) connected to associated MSWD and SAW devices. Such a MMIC is potentially a relatively low-cost compact component for incorporation into GPS systems.

It will be appreciated by those skilled in the art that variations may be made to the receiver 10 and to the GPS receiver 100 described in the foregoing without departing from the scope of the invention. For example, the link 20 can be replaced by a filter network operative to bias the transistor 14 to provide reflective gain whilst imparting a narrower passband characteristic to the receiver 10, thereby making it more frequency selective. Moreover, the transistor 14 can be a silicon transistor when the circuit 10 is operable to receive radiation at relatively lower frequencies, for example at VHF frequencies in a range of 100 MHz to 150 MHz.

The receiver 10 is operable to inherently additionally provide an automatic gain control (AGC) characteristic for compressing the dynamic range of signals applied to the receiver 10. By appropriate choice of negative resistance exhibited by the transistor 14 at its gate electrode 14g, the current $I_{FET}$ can be arranged to decrease in response to increased input signal strength so that the negative resistance exhibited at the gate electrode 14g changes to provide reduced gain.

By incorporating a frequency-sensitive cutoff filter, for example a bandpass filter, in a signal path between the antenna 12 and the gate electrode 14g, it is feasible to convert the AM receiver 10 into a frequency modulation (FM) receiver for demodulating frequency modulated radiation. The filter is operative, for example slightly off resonance, to provide signal attenuation for signals propagating therethrough in response to frequency change of the signals; such attenuation is manifest as amplitude modulation in signals provided from the filter which the transistor 14 is operative to demodulate. Moreover, because the receiver 10 can be adapted to be an FM receiver, it is also capable of functioning as a phase detector for demodulating phase modulated radiation and signals.

The invention claimed is:

1. An amplitude modulation receiver for receiving an input signal and generating a corresponding demodulated signal, comprising: a transistor biased to be simultaneously operable as a reflection amplifier for reflectively amplifying the input signal, and as a detector for detecting an amplified input signal to generate the demodulated signal.

2. The receiver according to claim 1, wherein the transistor is operative in a non-linear region of its current/voltage transfer characteristic.

3. The receiver according to claim 2, wherein the transistor is operable to conduct a current therethrough in a range of 5 µA to 110 µA to function in said non-linear region.

4. The receiver according to claim 1, wherein the transistor incorporates an electrode for receiving the input signal, the electrode being connected through a signal path to a signal earth such that the path is operable for conveying reflected signals between the transistor and the signal earth, and for diverting the input signal to the electrode.

5. The receiver according to claim 1, and an antenna assembly for receiving input radiation and generating therefrom the input signal for the transistor.

6. The receiver according to claim 1, wherein the receiver has a gain which is responsive to a magnitude of the input signal, thereby providing the receiver with an automatic gain control characteristic.

7. A frequency modulation (FM) receiver, comprising: an amplitude modulation (AM) receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal; and converting means for converting an input frequency modulated signal applied thereto into a corresponding amplitude modulated signal, the AM receiver being operable for demodulating the amplitude modulated signal to provide a demodulated output signal.

8. The receiver according to claim 7, wherein the converting means comprises a bandpass filter operable off resonance for converting the frequency modulated signal into the corresponding amplitude modulated signal.

9. A global positioning satellite (GPS) receiver, comprising: a modulation receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal; receiving means for receiving input radiation and for generating a corresponding received signal; and processing means for filtering, amplifying and gating the received signal to provide input signals for the modulation receiver to demodulate to provide demodulated signals from which a positional reference for the GPS receiver is derivable.

10. The receiver according to claim 9, wherein the receiving means is a circularly polarized antenna.

11. The receiver according to claim 9, wherein the processing means incorporates reflection amplifiers for amplifying and gating the received signal for generating processed signals.

12. The receiver according to claim 9, wherein the processing means incorporates magnetostatic filtering and frequency selective limiting means for processing the received signal.

13. An identification tag, comprising: a modulation receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal, the modulation receiver being operable to be responsive to radio radiation received thereat.

14. A wireless local area network for interconnecting computers, the network comprising: a modulation receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal, the modulation receiver being operative for performing demodulation of signals within the network.

15. A mobile telephone, comprising: a modulation receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal, the modulation receiver being operable to provide demodulation of signals propagating therein.

16. An electronic security key, comprising: a modulation receiver for receiving an input signal and generating a corresponding demodulated signal, including a transistor biased to be simultaneously operable as a reflection amplifier for reflectively amplifying the input signal, and as a detector for detecting an amplified input signal to generate the demodulated signal, the modulation receiver being operative for performing demodulation of signals propagating therein.

17. The key according to claim 16, wherein the receiver is housed within a key fob.

18. A method of amplitude demodulating an input signal, the method comprising the simultaneously executable steps of:
   a) biasing a transistor to be simultaneously operable as a reflection amplifier and as a detector;
   b) receiving the input signal and reflectively amplifying the input signal in the transistor operating as the reflection amplifier to generate an amplified input signal; and
   c) passing the amplified input signal through the transistor operating as the detector in a non-linear mode to demodulate the amplified input signal and thereby generate a corresponding demodulated signal.

* * * * *

UNITED STATES PATENT AND TRADEMARK OFFICE
CERTIFICATE OF CORRECTION

| | | |
|---|---|---|
| PATENT NO. | : 7,065,328 B1 | Page 1 of 1 |
| APPLICATION NO. | : 10/018762 | |
| DATED | : June 20, 2006 | |
| INVENTOR(S) | : I.J. Forster et al. | |

It is certified that error appears in the above-identified patent and that said Letters Patent is hereby corrected as shown below:

| COLUMN | LINE | ERROR |
|---|---|---|
| Title page (56) Pg. 1, col. 2 | Refs. Cited (Other Publs., Item 1) | "*HEMY-MMIC*" should read --*HEMT-MMIC*-- |
| Title page (56) Pg. 1, col. 2 | Refs. Cited (Other Publs., Item 1) | "*Diider by two,*" should read --*Divider by Two,*-- |
| 3 | 26 | "SR." should read --$S_R$.-- |
| 3 | 41 | "an reflectively" should read --a reflectively-- |
| 4 | 7 | "$S_R k_2 S_m \sin \omega_R t$" should read --$S_R = k_2 S_m \sin \omega_R t$-- |
| 6 | 9 | "one ordinary skilled" should read --one of ordinary skill-- |
| 6 | 65 | "provides+20" should read --provides +20-- |
| 7 | 62 | "S1" should read --$S_1$-- |

Signed and Sealed this

Third Day of April, 2007

JON W. DUDAS
*Director of the United States Patent and Trademark Office*